US007092214B2

(12) United States Patent
Hernandez

(10) Patent No.: US 7,092,214 B2
(45) Date of Patent: Aug. 15, 2006

(54) WIRELESS SUSPENSION DESIGN TO ACCOMMODATE MULTIPLE DRIVE DESIGNS

(75) Inventor: Manuel A. Hernandez, San Jose, CA (US)

(73) Assignee: SAE Magnetics (H.K.) Ltd., Shatin (HK)

( * ) Notice: Subject to any disclaimer, the term of this patent is extended or adjusted under 35 U.S.C. 154(b) by 37 days.

(21) Appl. No.: 10/229,591

(22) Filed: Aug. 27, 2002

(65) Prior Publication Data

US 2003/0067720 A1 Apr. 10, 2003

Related U.S. Application Data

(60) Provisional application No. 60/316,154, filed on Aug. 28, 2001.

(51) Int. Cl.
*G11B 5/48* (2006.01)

(52) U.S. Cl. ........................................ 360/245.9

(58) Field of Classification Search ............ 360/245.9, 360/245.8, 234.5, 234.4, 281.7, 281
See application file for complete search history.

(56) References Cited

U.S. PATENT DOCUMENTS

| | | | | |
|---|---|---|---|---|
| 5,427,848 | A * | 6/1995 | Baer et al. | 428/332 |
| 5,499,161 | A | 3/1996 | Hosseinzadeh et al. | 361/749 |
| 5,708,541 | A * | 1/1998 | Erpelding | 360/264.2 |
| 5,844,753 | A | 12/1998 | Inaba | 360/104 |
| 5,923,501 | A * | 7/1999 | Suzuki et al. | 360/264.2 |
| 6,021,025 | A * | 2/2000 | Komura et al. | 360/266.3 |
| 6,108,162 | A | 8/2000 | Amirkiai et al. | 360/97.01 |
| 6,396,665 | B1 * | 5/2002 | Asano | 360/264.2 |
| 6,452,754 | B1 * | 9/2002 | Mizuta et al. | 360/266.3 |
| 6,466,413 | B1 * | 10/2002 | Takasugi | 360/245.9 |
| 6,563,676 | B1 * | 5/2003 | Chew et al. | 360/264.7 |

* cited by examiner

*Primary Examiner*—Angel Castro
(74) *Attorney, Agent, or Firm*—Kenyon & Kenyon LLP

(57) ABSTRACT

A wireless suspension design is described that can be used in varying types of drive designs. In one embodiment, a flex circuit is provided with at least two indicia to indicate where the flex circuit is to be bent when attaching it to a head stack assembly.

7 Claims, 6 Drawing Sheets

100

B

A

101

WIRELESS SUSPENSION DESIGN TO ACCOMMODATE MULTIPLE DRIVE DESIGNS

The present application claims priority to U.S. App. Ser. No. 60/316,154 filed on Aug. 28, 2001.

BACKGROUND OF THE INVENTION

The present invention is directed to suspension designs in disk drives. More particularly, the present invention pertains to wireless suspension designs that may be used in multiple drive designs.

Hard disk drives that utilize magnetic read/write heads are well-known in the art. A common component of a hard disk drive is a head stack assembly (HSA). An HSA includes an actuator (which incorporates an E-block), a head gimbal assembly (HGA) and an actuator flex assembly. The flex assembly is a flex circuit that is typically attached to an integrated circuit chip that processes data read from the disk and data to be written to the disk. The actuator flex assembly is connected to the HGA. The end result for the HSA is that the magnetic head of the HGA is electrically connected to the integrated circuit chip.

A typical HGA includes a magnetic read/write head that is attached to or incorporated into a slider (which typically include an air bearing surface to allow the head to "fly" over the moving disk). The slider is attached to a flexure, which provides support for the slider and controls the pitch and roll of the slider relative to the moving disk. The high speed rotation of a magnetic disk generates a stream of air flow or wind along its surface in a direction substantially parallel to the tangential velocity of the disk. The air flow cooperates with the ABS of the slider body which enables the slider to fly above the spinning disk. In effect, the suspended slider is physically separated from the disk surface through this self-actuating air bearing. The ABS of a slider is generally configured on the slider surface facing the rotating disk, and greatly influences its ability to fly over the disk under various conditions.

As shown in FIG. 1 an ABS design known for a common catamaran slider 5 may be formed with a pair of parallel rails 2 and 4 that extend along the outer edges of the slider surface facing the disk. Other ABS configurations including three or more additional rails, with various surface areas and geometries, have also been developed. The two rails 2 and 4 typically run along at least a portion of the slider body length from the leading edge 6 to the trailing edge 8. The leading edge 6 is defined as the edge of the slider that the rotating disk passes before running the length of the slider 5 towards a trailing edge 8. As shown, the leading edge 6 may be tapered despite the large undesirable tolerance typically associated with this machining process. The transducer or magnetic element 7 is typically mounted at some location along the trailing edge 8 of the slider as shown in FIG. 1. The rails 2 and 4 form an air bearing surface on which the slider flies, and provide the necessary lift upon contact with the air flow created by the spinning disk. As the disk rotates, the generated wind or air flow runs along underneath, and in between, the catamaran slider rails 2 and 4. As the air flow passes beneath the rails 2 and 4, the air pressure between the rails and the disk increases thereby providing positive pressurization and lift. Catamaran sliders generally create a sufficient amount of lift, or positive load force, to cause the slider to fly at appropriate heights above the rotating disk. In the absence of the rails 2 and 4, the large surface area of the slider body 5 would produce an excessively large air bearing surface area. In general, as the air bearing surface area increases, the amount of lift created is also increased. Without rails, the slider would therefore fly too far from the rotating disk thereby foregoing all of the described benefits of having a low flying height.

As illustrated in FIG. 2, a head gimbal assembly 40 often provides the slider with multiple degrees of freedom such as vertical spacing, or pitch angle and roll angle which describe the flying height of the slider. As shown in FIG. 2, a suspension 74 holds the HGA 40 over the moving disk 76 (having edge 70) and moving in the direction indicated by arrow 80. In operation of the disk drive shown in FIG. 2, an actuator 72 moves the HGA over various diameters of the disk 76 (e.g., inner diameter (ID), middle diameter (NM) and outer diameter (OD)) over arc 75.

A preamplifier is typically connected to the head to supply write currents to the write head and receive currents from the read head. The suspension provides two functions: mechanical support and electrical connection between the head and the preamplifier. Rather than using physical wires to connect the head to the preamplifier, metal traces on the suspension are quite often used.

The preamplifier resides in a subassembly common referred to as the Actuator Flex Preamp Assembly (AFPA) The preamplifier is usually soldered to a flexible circuit. This flexible circuit provides the areas to which the HGA traces will be connected to complete the circuit connecting the preamplifier to the read and write elements of the head.

Generally, there are two types of HGAs—wired and wireless. A wired HGA is one where separate lead wires are connected between the flex circuit of the HSA and the read write head. A wireless HGA is one where conductive traces are integrated with the flexure and provide conductivity between the flex circuit of the HSA and the read write head of the slider. In the art, there are typically two types of wireless suspensions. In the first type, such as trace suspension assemblies (TSAs) and circuit integrated suspension (CISs), traces are built though a subtractive process (e.g., an etching operation) or through an additive process (e.g., a plating or deposition process) on the stainless steel flexure, with an insulative layer between the trace and the flexure. After the traces are set in place, the flexure can then be welded to other parts of the suspension. In the second type, such as flex suspension assemblies (FSAs) and flex on suspension (FOS), the traces are built on an insulation layer and then covered with another insulation layer to form a flex circuit. This circuit is then attached to the suspension with adhesive. Alternatively, an additional metal layer called a ground plane can be attached to the flex circuit before it is adhered to the suspension. In an FSA, the flexure is integrated with a load beam and a mount plate along with the integrated traces for connectivity.

Typically four traces are supplied for a single head: one pair for the connection between the read head and the pre amplifier and one pair for the connection between the write head and the preamplifier.

As seen from the above, there are various types of HGA and HSA designs. The designs that are selected depend on the disk drive under consideration. Once the designs are selected, the flex circuit will require electrical connection in the process of manufacturing HSAs. As is known in the art, the flex circuit of the HGA usually requires attachment at two ends of the circuit. On one end, the flex circuit will be attached to the side of the assembly that includes the slider's air bearing surfaces. For a wireless HGA like the so-called TSA suspension, bonding pads are provided adjacent to the slider which are soldered or otherwise electrically connected to the conductors of the flex circuit. On the other end of the HGA circuit, the traces will be attached to areas in the AFPA that will lead to the preamplifier. Because of the placement of the integrated circuit chip, the flex circuit is usually attached to a side of the AFPA that is orthogonal to the surface of the HGA where the circuit is bonded. During manufacture, the flex circuit is usually bent at a 90 degree angle before attaching it to the AFPA. Because of differing dimensions for the various designs set forth above, manufacturers typically fabricate a variety of flex circuits specific to the designs and/or the disk drives that contain the flex circuits. Such a process leads to the potential for increased costs in manufacture and lost costs in unneeded flex circuits.

SUMMARY OF THE INVENTION

According to an embodiment of the present invention, a flex circuit is presented that is designed to accommodate multiple drive designs. In one embodiment, the flex circuit includes two or more bending lines so that the flex circuit can be bent at two or more different locations depending on the disk drive assembly being used. Doing so may result in a significant reduction in manufacturing costs.

DETAILED DESCRIPTION

Figure 1:
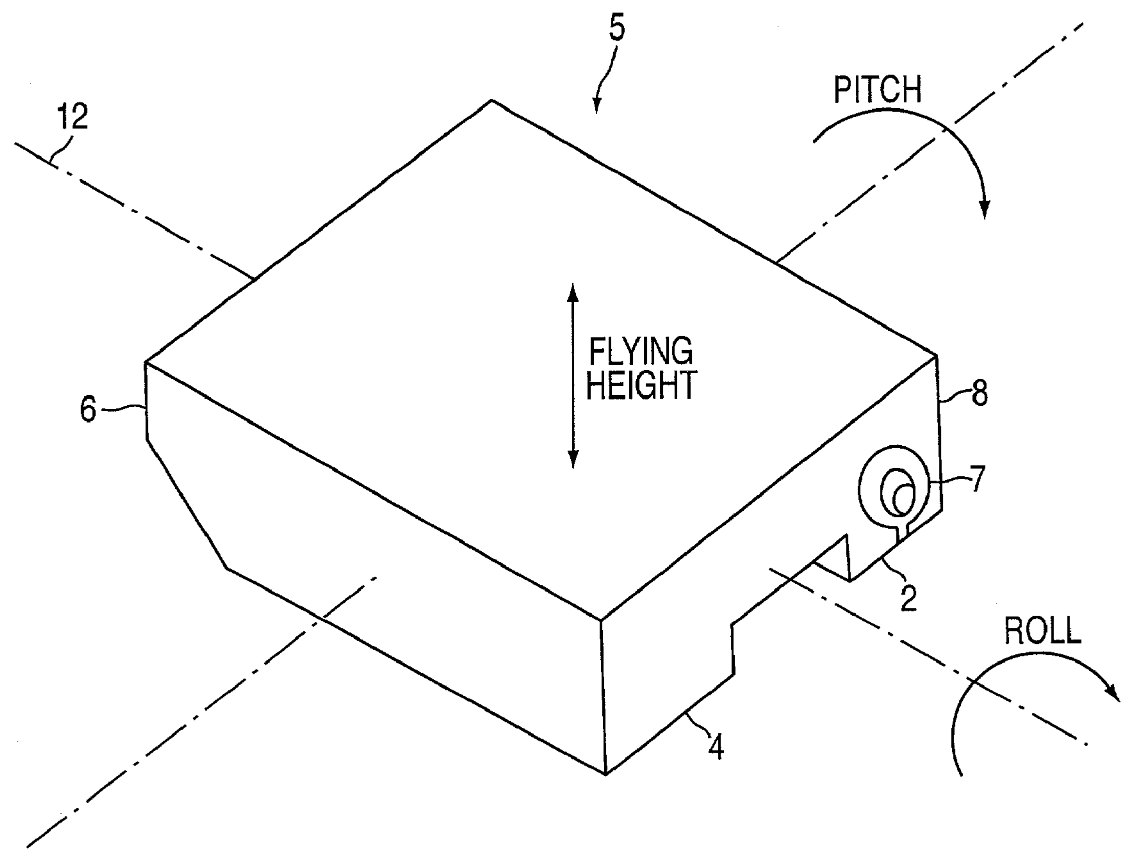
FIG. 1 is a perspective view of a slider device with a read/write head that is known in the art.
Figure 2:
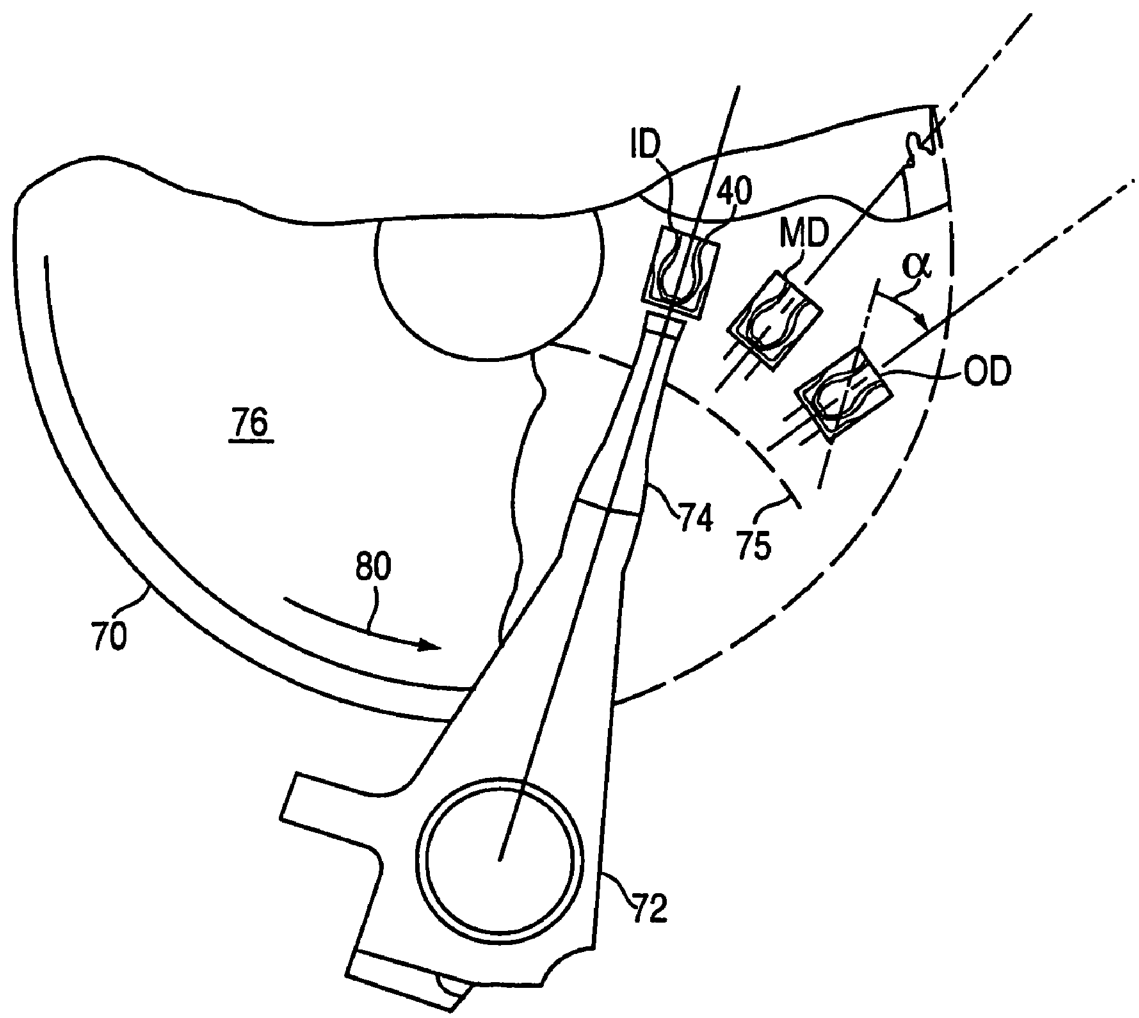
FIG. 2 is a perspective view of a disk drive device that is known in the art.
Figure 3:
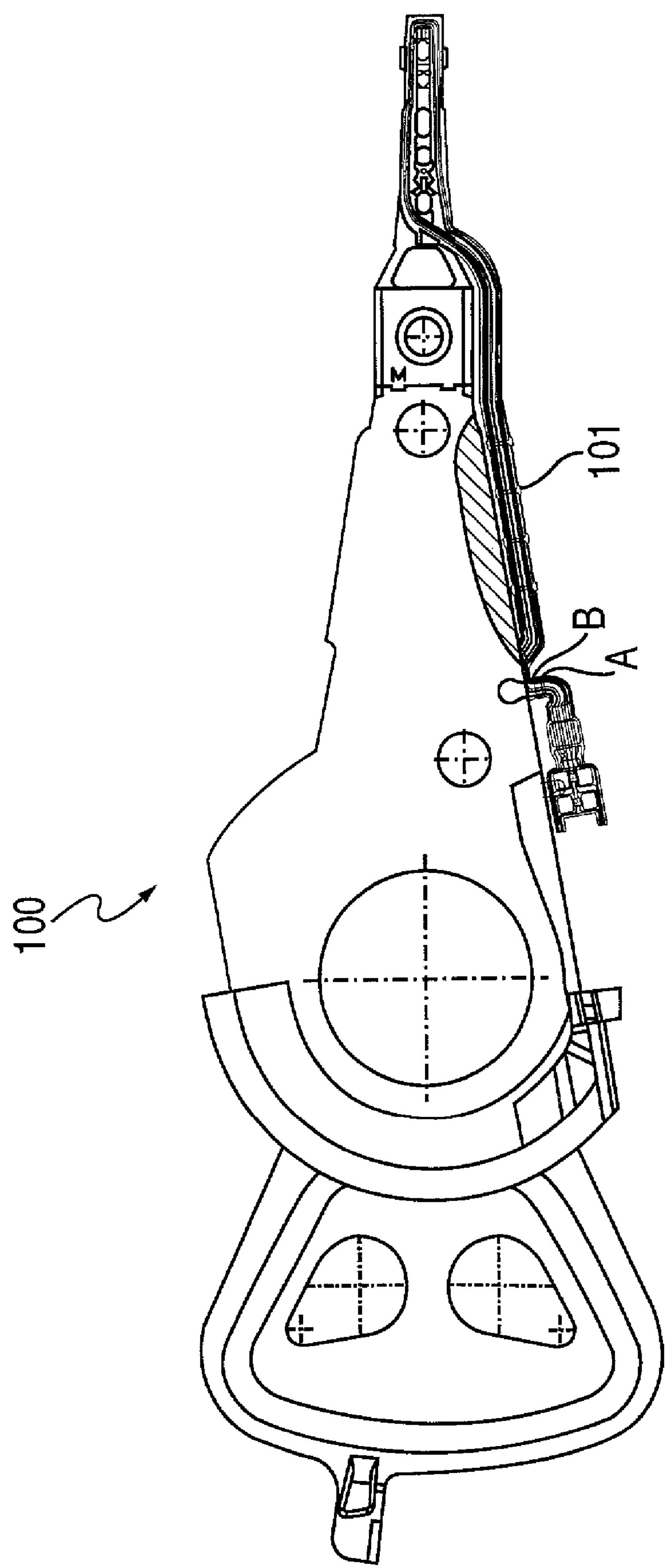
FIG. 3 is an overhead view of a suspension assembly utilizing a flex circuit constructed according to an embodiment of the preset invention.

Referring to FIG. 3, an overhead view of a suspension assembly 100 is shown using a flex circuit constructed according to an embodiment of the present invention. In this embodiment of the present invention, the flex circuit 101 includes a substrate made of polyamide and conductors made of copper, but is not limited to these materials. As described below the flex circuit of the present invention has a design that allows it to be used with multiple disk drive designs.

Figure 4:
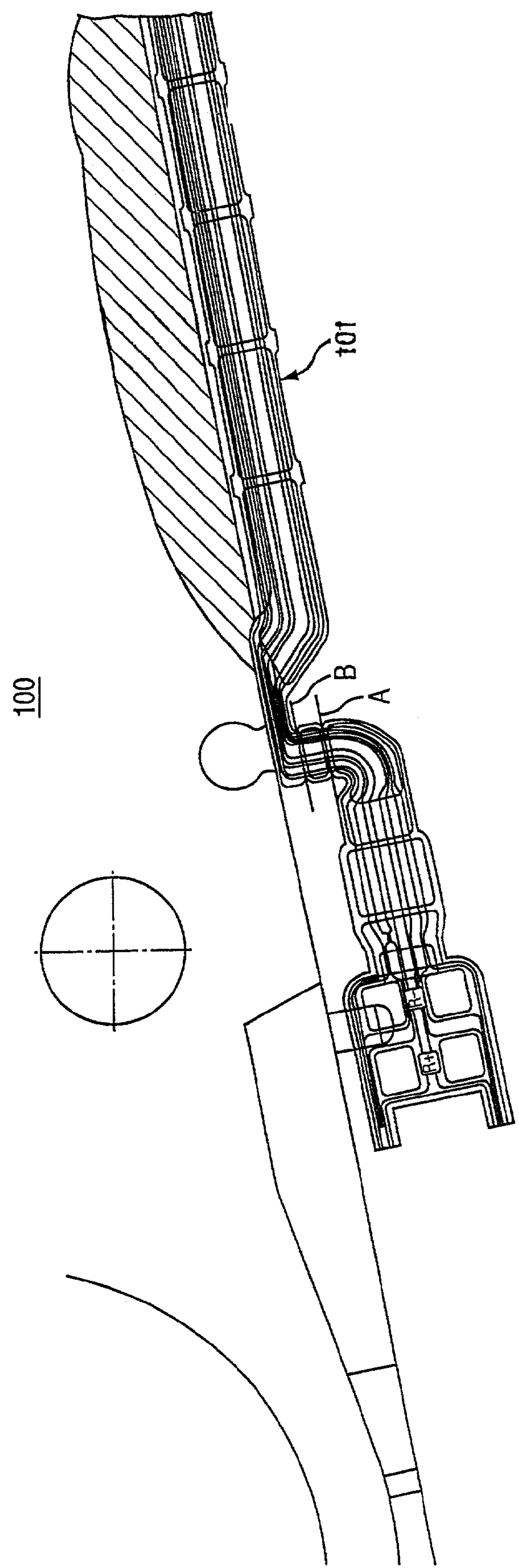
FIG. 4 is a closer view of a feature of the flex circuit of FIG. 3.

Referring to FIG. 4, a close up view is shown of a feature of the flex circuit shown in FIG. 3. As seen in FIG. 4, the flex circuit 101 includes a plurality of indicia to indicate where the flex circuit is to be bent (e.g., on a suspension assembly). In this example, the indicia includes a pair of notches in the substrate material of the flex circuit. Accordingly, the flex circuit is to be bent along a line indicated by a first pair of notches A or a second pair of notches B depending on the design of the disk drive.

Figure 5:
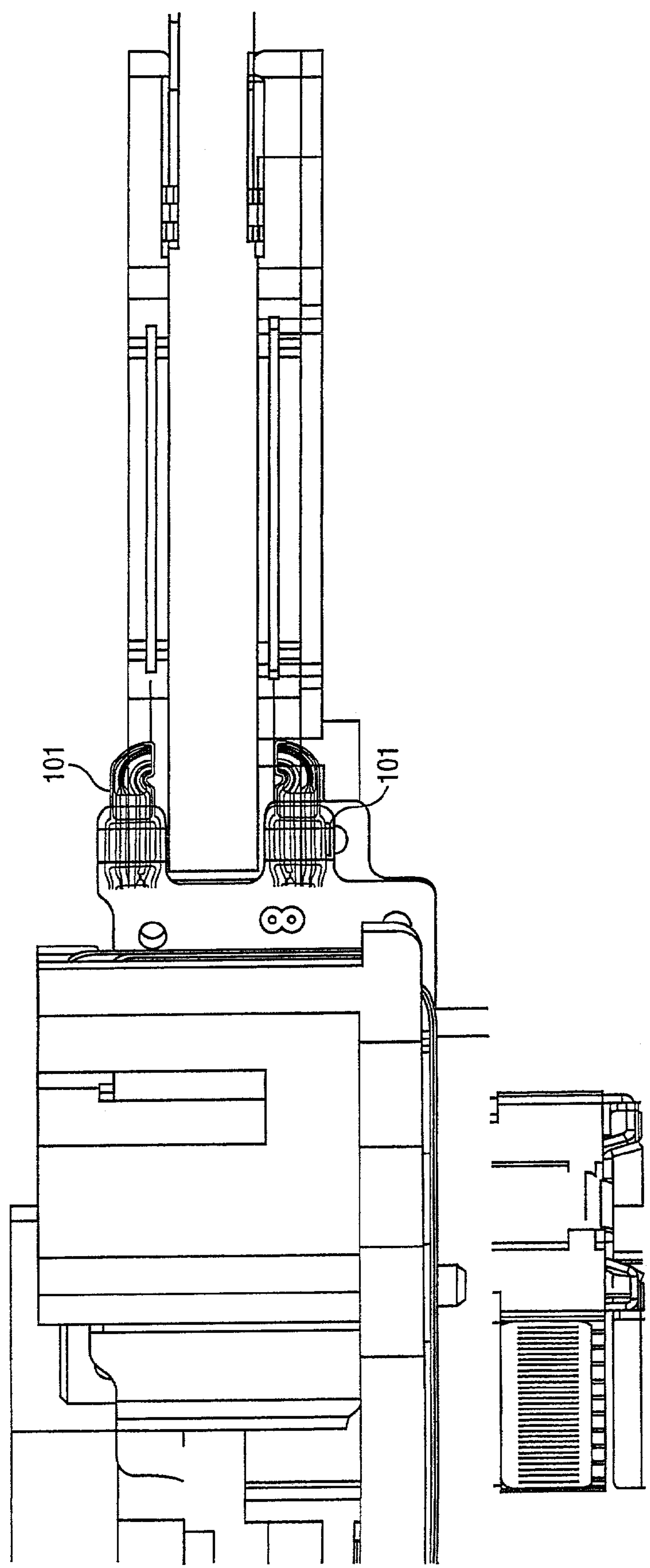
FIG. 5 is a side view of a suspension in a first disk drive using the flex circuit of FIG. 3.
Figure 6:
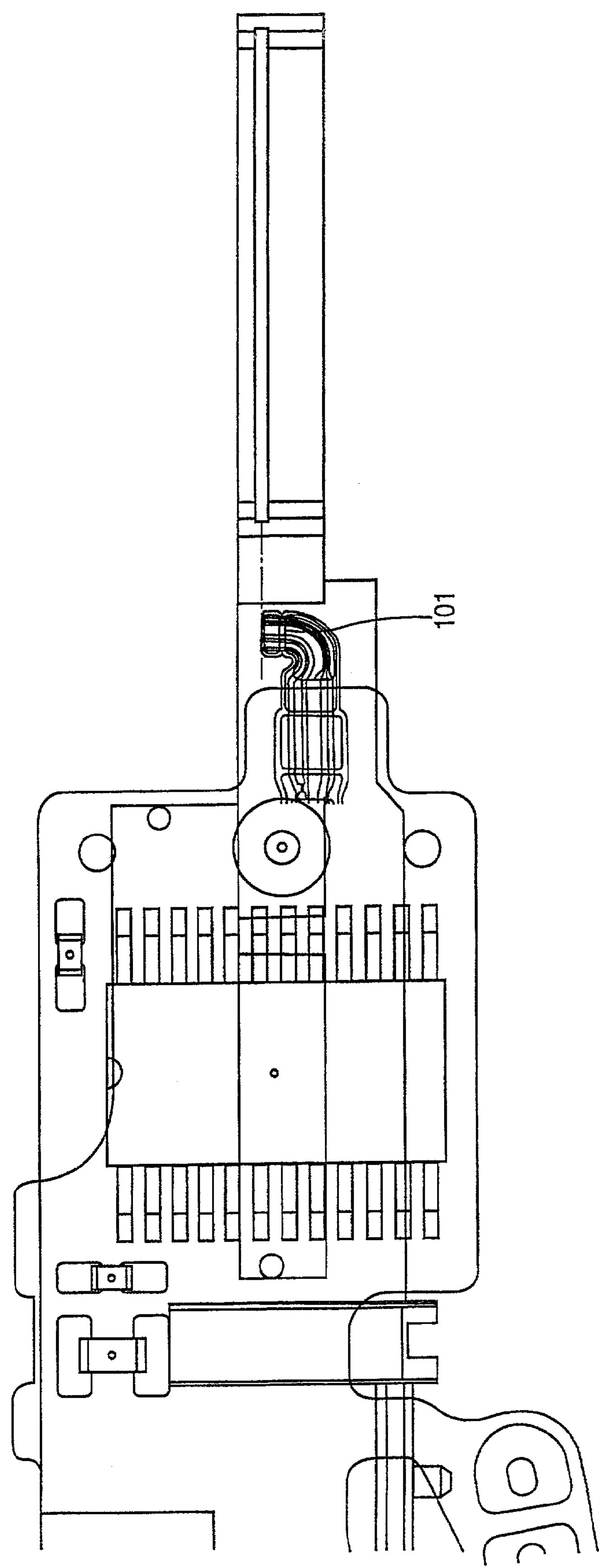
FIG. 6 is a side view of a suspension in a second disk drive using the flex circuit of FIG. 3.

Referring to FIGS. 5 and 6, the flex circuit of FIG. 3 is shown in its bent condition for two disk drives. In FIG. 5, a first disk drive is shown, where the flex circuit is bent 90 degrees at the first pair of indicia A prior to or after being attached to a suspension for the drive. In FIG. 6, the flex circuit is bent 90 degrees at the second pair of indicia B prior to or after being attached to a suspension for the drive.

While the present invention has been described with reference to the aforementioned applications, this description of the preferred embodiments is not meant to be construed in a limiting sense. It shall be understood that all aspects of the present invention are not limited to the specific depictions, configurations or dimensions set forth herein which depend upon a variety of principles and variables. Various modifications in form and detail of the disclosed apparatus, as well as other variations of the present invention, will be apparent to a person skilled in the art upon reference to the present disclosure. It is therefore contemplated that the appended claims shall cover any such modifications or variations of the described embodiments as falling within the true spirit and scope of the present invention. For example, though the invention has been described with respect to a flex circuit that attaches to a head assembly, it can be extended to trace suspension assemblies that utilize flex circuits, as well.

What is claimed is:

1. A flex circuit to be coupled in a disk drive comprising:
a substrate;
a plurality of conductors deposited with respect to said substrate;
wherein said substrate includes indicia to indicate where the flex circuit is to be bent in at least two places.

2. The flex circuit of claim 1 wherein said substrate is polyamide.

3. The flex circuit of claim 2 wherein said conductors are made of copper.

4. A suspension assembly comprising:
a head gimbal assembly;
a suspension coupled to said head gimbal assembly;
a flex circuit coupled to said head gimbal assembly wherein said flex circuit includes indicia to indicate where the flex circuit is to be bent relative to said suspension assembly in at least two places.

5. The suspension assembly of claim 4 wherein said flex circuit includes a substrate and a plurality of conductors deposited with respect to said substrate.

6. A disk drive comprising:
a disk capable of being rotated and to store data thereon;
a suspension assembly including
a head gimbal assembly;
a suspension coupled to said head gimbal assembly;
a flex circuit coupled to said head gimbal assembly wherein said flex circuit includes indicia to indicate where the flex circuit is to be bent relative to said suspension in at least two places.

7. The disk drive of claim 6 wherein said flex circuit includes a substrate and a plurality of conductors deposited with respect to said substrate.

* * * * *